United States Patent
Mayr Adam et al.

(10) Patent No.: US 12,019,958 B2
(45) Date of Patent: Jun. 25, 2024

(54) METHOD AND APPARATUS FOR AUTOMATED TEST PLAN GENERATION TO MEASURE A MEASUREMENT OBJECT

(71) Applicant: Carl Zeiss Industrielle Messtechnik GmbH, Oberkochen (DE)

(72) Inventors: Ana Carolina Mayr Adam, Aalen (DE); Stephan Rieger, Oberkochen (DE); Florian Mayer, Backnang (DE)

(73) Assignee: Carl Zeiss Industrielle Messtechnik GmbH, Oberkochen (DE)

(*) Notice: Subject to any disclaimer, the term of this patent is extended or adjusted under 35 U.S.C. 154(b) by 714 days.

(21) Appl. No.: 16/950,629

(22) Filed: Nov. 17, 2020

(65) Prior Publication Data
US 2021/0173973 A1 Jun. 10, 2021

Related U.S. Application Data

(63) Continuation of application No. PCT/EP2018/063001, filed on May 17, 2018.

(51) Int. Cl.
*G06F 30/20* (2020.01)
*G06F 30/10* (2020.01)

(52) U.S. Cl.
CPC .............. *G06F 30/20* (2020.01); *G06F 30/10* (2020.01)

(58) Field of Classification Search
CPC ........... G06F 30/13; G06F 30/20; G06N 5/01
USPC .......................................................... 703/1
See application file for complete search history.

(56) References Cited

U.S. PATENT DOCUMENTS

| | | | |
|---|---|---|---|
| 7,445,945 B1* | 11/2008 | Markle | H01L 22/14 257/E21.531 |
| 2017/0344464 A1* | 11/2017 | Misra | G06F 11/3684 |
| 2018/0045511 A1 | 2/2018 | Georgi et al. | |
| 2018/0089360 A1 | 3/2018 | Madsen et al. | |

FOREIGN PATENT DOCUMENTS

| | | |
|---|---|---|
| DE | 19821371 A1 | 11/1999 |
| WO | WO-2014191130 A2 | 12/2014 |

OTHER PUBLICATIONS

Kormann et al. (Automated Test Case Generation Approach for PLC Control Software Exception Handling using Fault Injection, (8 pages)). (Year: 2011).*

* cited by examiner

*Primary Examiner* — Andre Pierre Louis
(74) *Attorney, Agent, or Firm* — Miller Johnson

(57) ABSTRACT

A method for generating a test plan for testing a measurement object includes obtaining a data record representing the measurement object. The method includes setting a reference structure based on the data. The method includes assigning at least one reference structure-specific test feature to the reference structure. A test is carried out based on data for the data record representing the measurement object as to whether structures that are similar to or the same as the reference structure are present. The reference structure-specific test feature is assigned to each similar or same structure as the structure-specific test feature. The method includes generating the test plan to include the structure-specific test features.

19 Claims, 4 Drawing Sheets

METHOD AND APPARATUS FOR AUTOMATED TEST PLAN GENERATION TO MEASURE A MEASUREMENT OBJECT

CROSS-REFERENCE TO RELATED APPLICATIONS

This application is a continuation of International Application No. PCT/EP2018/063001 filed May 17, 2018. The entire disclosure of the application referenced above is incorporated by reference.

FIELD

The present disclosure is directed to industrial measurement technology and more particularly to generating a test plan for testing a workpiece.

BACKGROUND

The generation of so-called test plans for testing or measuring workpieces is known, with such a test plan defining parameters of a test process, by means of which the quality of a workpiece or measurement object can be determined. By way of example, such a test plan can be set up on the basis of certain general standards or manufacturer or customer specifications. Here, the test plan is carried out by an appropriate testing or measuring appliance, for example by a so-called coordinate measuring machine.

This test plan contains the test features, to be tested, of a workpiece to be measured or information items in relation to these test features. By way of example, such test features can be the distance between the centers of two bores, the deviations of measurement points on a free-form surface from a target form, the relative position of the center of a bore, the diameter of a bore, etc. Likewise, the test plan can contain information items relating to a relative position and shape of the workpiece to be tested, e.g., in a test coordinate system, and information items relating to the target values of test features. Information items relating to the shape can be contained in the test plan, for example in the form of a CAD model. Such a CAD model can also set the aforementioned target values. Further, the test plan can comprise tolerance specifications for a test feature.

Further, the test plan could set work instructions for carrying out the test defined by the test plan, e.g., in the form of commands, the test parameters to be set for carrying this out and generating data, e.g., illumination parameters or probing forces, and the test components to be used for carrying this out, e.g. sensors. Additionally, a test plan can contain test parameters, which can be set or altered while the test is running, e.g., in order to adapt later (partial) test processes.

Further, a test trajectory, e.g., of a sensor, to be traversed for carrying out the test can be set by the test plan. The test result documentation can also be set by the test plan.

The actual information items generated while the test plan is carried out, e.g., measurement points, images or measurement values, can likewise be stored in the test plan.

As explained above, measurement points to be captured by a measuring device or a measuring appliance can be set on the basis of the test plan, said measurement points being required for evaluating the test features. Then, a measurement procedure can be defined in order thereby to capture measurement points on the surface of the workpiece to be measured. Then, the measurement procedure set thus is worked through by the measuring appliance in a test step or a measurement step, as a result of which the required measurement points are subsequently captured and stored according to the measurement procedure set by the test plan. Thereafter, the individual test features of the test plan are evaluated on the basis of the recorded measurement points, and as a consequence, the data necessary for creating a measurement protocol are obtained.

By way of example, document DE 198 21 371 A1 describes a method for measuring a workpiece with an automated measurement procedure and a coordinate measuring machine which is correspondingly configured to carry out the method. The method comprises three fundamental method steps. In a first method step, the automated measurement procedure is specified, wherein the latter is specified on the basis of test features which are to be evaluated during a measurement procedure. In the process, geometric elements on the workpiece surface are selected using CAD data of the workpiece, which geometric elements are required to test the desired test features. In addition, the movement paths for the sensor for scanning the respective geometric elements are specified. In a second method step, a workpiece is then scanned according to the measurement procedure. In a third method step, the test features to be tested are then evaluated on the basis of the measurement data recorded in the measurement procedure and output to the user of the coordinate measuring machine in a form not described in any more detail. Such output typically takes place in the form of a measurement protocol, which is generated as an electronic document, for example a PDF document.

WO 2014/19130 A1 discloses a method for generating a virtual image representation of a measurement object.

SUMMARY

Applications in which groups of workpieces with the same shape in principle need to be measured are also known, with the workpieces however differing in at least one dimension. By way of example, this dimension can be the overall length. To measure such a group of workpieces, the user needs to either constantly change a parameter, for example the overall length, in software of the measuring appliance or re-measure the workpiece length every time.

The technical problem of developing a method, a program and an apparatus for generating a test plan for testing a measurement object or workpiece which simplify, more particularly accelerate, the generation of a test plan and consequently facilitate a simplified, more particularly accelerated, measurement and test of the measurement object arises.

The solution to the technical problem is evident from the subject matter having the features of independent claims 1, 13 and 14. Further advantageous configurations of the invention are evident from the dependent claims. It also goes without saying that, unless otherwise specified or evident, the features mentioned in the introductory description may also be provided individually or in any desired combination in the solution that is disclosed in the present case.

The inventors have recognized that the outlay for creating a test plan can be reduced if, for structures of the same or similar measurement object, which are similar to or the same as a known structure, an already existing test feature of this known structure is resorted to.

A method for generating a test plan for testing a measurement object, which can be a workpiece, for example, is proposed. In particular, the test plan can be generated in electronic form. As explained above, such a test plan contains or encodes at least one test feature, preferably a plurality of test features, of the measurement object to be measured. On the basis of the test plan, it is then possible to define measurement points to be captured and a measurement procedure for measuring the measurement object by an appropriate measuring device, in particular a coordinate measuring machine. Methods for setting the measurement points and for generating a measurement procedure from a test plan are known to a person skilled in the art and are not the subject matter of this invention.

In a first step, a data record representing the measurement object is provided. Here, this data record can be retrieved, for example from a storage device in which the data record is stored. In particular, such a retrieval of the data record can be implemented if the data record is a target data record, for example a CAD data record of the measurement object. Alternatively, the data record representing the measurement object can also be generated, in particular by measuring the measurement object. Here, the measurement can be carried out by an appropriate measuring device, in particular by a coordinate measuring machine.

The measurement object can be a component or workpiece (in particular one that has been manufactured industrially), an assembly or a general technical system. The data record can be generated on the basis of measuring geometric properties of the measurement object. In particular, the data record can contain or define information items, which allow corresponding geometric properties of the measurement object to be deduced, or which specify these, such as the contour, outline and/or form thereof. Suitable data formats or contents for describing such information items or properties are known to a person skilled in the art. In addition or as an alternative thereto, an orientation and/or a position of the measurement object can be ascertained in a predetermined coordinate system within the scope of the measurement and can preferably also be saved in a data record (or as an additional data record part). In general, the data record can comprise different subsets or partial data records which, in the totality thereof, however preferably combine the information items about the measurement object obtained by measurement.

Different measurement principles can be applied for a measurement, e.g., a tactile capture or an optical capture of the measurement object, in order to generate the corresponding data record. Consequently, the data record representing the measurement object can be a target data record or a data record generated by measurement. Measuring can be carried out by means of a suitable measuring device and/or a suitable measurement sensor. A coordinate measuring machine with a tactile or contactless measurement sensor mounted thereon is an example of a measuring device. The measurement can also be realized as an optical object measurement, for example on the basis of triangulation, stripe projection and/or camera capture. In addition or as an alternative thereto, the measurement can be carried out on the basis of passing radiation through an object, wherein use can be made of magnetic and/or x-ray radiation, for example. One example relates to measuring an object by means of computed tomography (CT). Further, the measurement object can be measured using light projection and/or by casting shadows.

In a further, in particular second step, a reference structure is set on the basis of data. Within the scope of the present disclosure, the term "on the basis of data" can generally mean that predetermined or ascertained data (or at least subsets thereof) are used and/or evaluated in order to carry out or prompt further measures on the basis thereof.

Here, setting can be implemented automatically, semi-automatically or manually, in particular by an appropriate input by a user. In particular, on the basis of data can mean that the reference structure in this case is represented by a reference structure-specific set (subset) of the data record. This reference structure-specific set (subset) can then be selected automatically, semi-automatically or manually. By way of example, at least one property of different subsets of the data record can be determined and can be compared to predetermined target properties of a reference structure on the basis of data, in particular automatically. Consequently, a potential reference structure can be compared to a predetermined target reference structure. Should the deviation of the property of one of these various subsets from the target property not exceed a predetermined measure, the latter can be set as reference structure. The reference structure can be set semi-automatically by virtue of, for example, a set (subset) of the data record being proposed to a user, said set (subset) potentially representing the reference structure, and the user then confirming this suggestion by way of a user interaction and/or making a selection from a possible plurality of suggestions. In particular, the suggesting can be implemented by way of the automatic determination of an appropriate data set, as explained above. For the automatic or semi-automatic selection, it is possible to carry out a comparison method for comparing a potential reference structure with a target reference structure. This may correspond to the comparison method, explained in more detail below, for comparing the reference structure with a structure that is potentially the same or similar, as a result of which reference can be made to the corresponding explanations.

By way of example, it is possible that at least one characteristic geometric element or one characteristic geometric property is detected in the data record, e.g., a saddle point, a circle, an edge, a corner and/or a line. In this case, a reference structure can be set by one such detected element or one such detected property, preferably by a geometric arrangement of the plurality of elements or properties relative to one another.

The reference structure can be set manually by way of an appropriate user input. By way of example, the user can select data points or data point sets by way of an appropriate input, said data points or data point sets representing the reference structure desired by the user or containing or comprising a representation of the reference structure desired by the user.

In a further step of the method, in particular in a third step of the method, at least one reference structure-specific test feature is assigned to the reference structure. Expressed differently, the at least one reference structure-specific test feature is set for the reference structure. Example test features were already explained in the introductory part. Thus, an assignment of at least one test feature to the reference structure is consequently set. This assignment can be stored, particularly in a storage device. In particular, the test feature can be a dimension-type variable, for example a length, a distance, a diameter, etc.

In a further step of the method, in particular in the fourth step of the method, a test on the basis of data is carried out for the data record representing the measurement object as to whether structures that are similar to or the same as the reference structure are present in this data record. This test can be implemented in automatic or semi-automatic fashion.

The test on the basis of data can also be implemented by virtue of a corresponding comparison method being carried out for the purposes of comparing the reference structure with a structure that is potentially the same or similar. In so doing, it is possible to determine a comparison measure, wherein a structure that is the same or similar is detected should the comparison measure correspond to a predetermined target measure or deviate from this target measure by no more than a predetermined measure.

As explained above, it is possible, for example, to determine at least one reference structure-specific property of the reference structure set previously to this end, said reference structure-specific property being determinable on the basis of data. In this case, the reference structure-specific property that is determinable on the basis of data denotes a property of the dataset, which comprises or contains a representation of the reference structure. Then, this can be compared to a property of the potentially same or similar structure. In this case, the test on the basis of data can be implemented, for example, by virtue of characteristic geometric or dimension-type properties, e.g., a length or a width, of the structures being determined and compared.

However, such a method can also be a pattern comparison method, for example. In particular, a comparison method can be a form-based or structure-based comparison or matching method, which is also known by the term of shape-based matching. Additionally, such a method can be a correlation method, in particular a cross-correlation method. Additionally, such a method can be a distance-determining method, for example for determining a distance between intensity values of data points.

To carry out the comparison method, it may be necessary to determine patterns to be compared in the data record/the data records. In so doing, patterns can likewise be determined on the basis of data. Here, it is possible to apply pattern detection methods. By way of example, at least one geometric element or one geometric property can be detected in the data record, e.g., a saddle point, a circle, an edge, a corner and/or a line. This can be implemented by an appropriate method, e.g., by a saddle point extraction, circle extraction, edge extraction, corner extraction and/or line extraction. In this case, a pattern can be set by a detected element or a detected property, preferably by a geometric arrangement of a plurality of elements or properties relative to one another. Naturally, patterns could also be detected in other ways known to a person skilled in the art.

Further, the data record, in particular different subsets of the data of the data record, can be selected, the property (properties) of which are determined and compared with the at least one reference structure-specific property. A similar structure can be detected if the at least one property determined thus deviates by no more than a predetermined measure from the reference structure-specific property. A structure that is the same can be detected if the at least one property of the reference structure-specific property determined thus corresponds to the reference structure.

To this end, the data record can be searched for different subsets. Here, the data record can be searched by virtue of the data record being subdivided into various subsets of the same size, with each of these subsets then being examined accordingly. Here, the subsets can at least partly intersect. However, it is also possible for the subsets to be disjoint. Further, it is possible to carry out different iterations of the search, with a size and/or form of the subset being varied.

As explained above, a property-based detection of similar or the same structures can likewise be carried out within the scope of a semi-automatic test, with, however, only a candidate for a structure that is similar or the same being ascertained and being proposed as a structure that is potentially similar or the same to a user or an overarching system for confirmation purposes. In this case, the proposed structure is only determined as same or similar structure if the proposition is confirmed by the user or the overarching system.

In a further step, in particular a fifth step, the previously set reference structure-specific test feature is assigned to each similar or same structure as structure-specific test feature. Expressed differently, a structure that is similar or the same, which, in addition to the reference structure, is represented by the data record, in particular by a different subset of the data record, is assigned the same test feature as the reference structure.

Then, the resultant test plan comprises all of the structure-specific test features determined thus, i.e., in particular, the at least one reference structure-specific test feature and, for each similar or same structure, at least one structure-specific test feature, which corresponds to the reference structure-specific test feature.

What this advantageously achieves is that a user need not manually set all structures to be tested in the data record for the purposes of generating the test plan. Firstly, this reduces the time taken to generate a test plan and hence also to test the measurement object; secondly, this also increases operator convenience when generating the test plan.

In addition to the test features that should be determined for the object to be measured, the test plan can further also contain at least one test criterion, which is assigned to such a test feature. Then, following the measurement of the measurement object on the basis of the test plan and following the determination of the test feature, this test criterion can be evaluated on the basis of the consequently generated measurement data record. In particular, the test criterion can set the type of a comparison of the captured actual feature with a target feature. This is illustrated in even more detail below.

It is further possible for a test feature to be the number of same or similar structures, which are present in the data record representing the measurement object. In this case, a test criterion can be whether this number corresponds to a predetermined number or a number present in a target data record.

The test whether structures that are the same as or similar to the reference structure are present can be implemented for the data record representing the measurement object, on the basis of which the reference structure is set. Alternatively, the test as to whether structures that are similar to or the same as the reference structure are present can also be implemented in a further data record. Here, this further data record can be a further representation of the measured object.

Here, the data of the further data record can represent the same measurement object as the data of the data record, on the basis of which the reference structure is set. However, these data could be generated by a different method to the data of the data record, on the basis of which the reference structure is set, e.g., by a different construction or measurement method.

Alternatively, data of the further data record can represent a further measurement object, in particular a measurement object of the same type, the same series, or the same category.

When setting the reference structure, it is also possible to determine a position and/or orientation of the reference structure and store this where applicable, in particular in order to subsequently set measurement points. Here, the position and/or orientation can be determined in a predetermined coordinate system, for example a coordinate system of the data record or in a coordinate system of the measurement object. A spatial relationship between different coordinate systems may be known in advance by way of an appropriate registration.

Further, it is possible that positions and/or orientations of the similar or same structures are determined, in particular in order to subsequently set further measurement points. These can also be stored.

Consequently, the test plan may also contain the reference structure-specific position/orientation and/or the structure-specific positions and/or orientations in addition to the reference structure-specific and structure-specific test features.

In a further embodiment, at least one geometric element is assigned to the reference structure, wherein the reference structure-specific test feature is determined on the basis of or depending on the at least one geometric element.

Here, in accordance with the explanations made above, the geometric element can be assigned to the reference structure in automatic or semi-automatic fashion or by a user.

In particular, a geometric element can be an element from the list of point, straight line, line, curve, free-form surface, plane, torus, cone, paraboloid, sphere, cylinder, ellipse, circle, slot, groove and rectangle. In particular, the measurement points of the measurement object to be captured for determining the test feature, in particular said measurement points on the surface of the measurement object, can be defined on the basis of the geometric element. By way of example, if the roundness of a cylindrical blind hole or a cylindrical passage opening should be determined as a test feature, in particular at a predetermined point or level in the blind hole or in the passage opening, then the circle can be set as the geometric element to be assigned to the test feature.

In turn, this advantageously facilitates simplified driving of a measuring device in order to capture the measurement points.

Expressed differently, the test plan then also contains at least one reference structure-specific geometric element in addition to the reference structure-specific test feature. If similar or same structures are determined and the reference structure-specific test feature is assigned to the latter, the at least one geometric element is likewise assigned to these structure-specific test features as a result. Information items of the geometric element can be used to set corresponding measurement points.

This advantageously results in a further acceleration in the generation of the test plan and a further improvement of the user convenience since, for example, a user need only set one or more geometric element(s) for a structure once, specifically for the reference structure, which geometric elements are required for determining the test feature, in particular are to be captured during the subsequent measurement.

In a further embodiment, the data record representing the measurement object, in which the reference structure then is determined, is generated by measuring the respective measurement object. As explained above, the measurement can be implemented using different measuring methods, in particular tactile measuring methods or optical measuring methods. In particular, a form of a surface of the measurement object can be measured in the process. Here, use can also be made of different measuring devices, in particular the coordinate measuring machine explained above.

Here, it is advantageously possible for a reference structure to be set in a measurement data record only once, for example by a user, wherein a measurement data record can subsequently be searched for the same or similar structures, in automatic or semi-automatic fashion, and the reference structure-specific test feature can then be assigned to these structures for the purposes of generating the test plan. This accelerates the generation of the test plan for a measurement object to be measured, and consequently also the test.

In this case, the test of the measurement object, i.e., the evaluation of test feature-based test criteria, could likewise be carried out on the basis of this data record generated by the measurement.

Alternatively, the data record representing the measurement object can be a target data record. In particular, such a target data record can be a construction data record, for example a CAD data record. In this case, the search for similar or the same structures can be carried out in a further data record, as explained above, in particular in a data record generated by the measurement of a measurement object, wherein this measurement object was generated in accordance with the information items of the construction data record. In this case, the test of the measurement object, i.e., the evaluation of test feature-based test criteria, could likewise be carried out on the basis of this further data record generated by the measurement.

However, it is also possible to determine the same or similar structures in the target data record, too. In this case, position and/or orientation information items of these structures can be stored and used for the search in a further data record, for example for selecting subsets to be searched in the further data record.

What advantageously arises as a result thereof is that, on account of the ideally error-free target data record, a user can reliably specify the structures and test features intended to be evaluated for testing the measurement object already before the actual measurement. This in turn increases user convenience.

In a further embodiment, a test is carried out on the basis of data for a further data record representing the measurement object or a further measurement object as to whether structures that are similar to or the same as the reference structure are present in this further data record. Further, the reference structure-specific test feature is assigned to each similar or same structure, wherein the test plan then comprises the structure-specific test features determined thus. The further data record has already been previously explained.

What advantageously arises as a result thereof is the acceleration of the generation of test plans for a plurality of measurement objects, in particular for similar measurement objects or measurement objects of the same kind, wherein the reference structure has to be set only once, in particular in a target data record of these similar measurement objects or measurement objects of the same kind or in a data record, generated by the measurement, of exactly one of these similar measurement objects or measurement objects of the same kind. In turn, this increases the user convenience when generating test plans.

In a further embodiment, the further data record is generated by measuring the measurement object or a measurement object of the same kind. In particular, this can be implemented if the data record in which the reference structure is set is a target data record of the measurement object. This and corresponding advantages have already been explained above. A measurement object of the same kind can be a measurement object of the same type or of the same series.

In a further embodiment, structure-specific position information items and/or orientation information items known in advance or determined in advance are taken into account during the test on the basis of data as to whether structures that are similar to or the same as the reference structure are present in the further data record.

By way of example, structure-specific position information items and/or orientation information items can be used to select subsets to be searched in the further data record, wherein these position information items and/or orientation information items were determined when evaluating a data record that differs from the further data record and that can also be referred to as structure position data record. Thus, a test can be carried out here on the basis of data as to whether structures that are the same as or similar to the reference structure are present in the structure position data record, wherein a structure-specific position information item and/or orientation information item can then be determined for further use.

In particular, the structure position data record can be a target data record. Alternatively, the structure position data record can be a data record that was generated using a measuring method which differs from the measuring method for generating the further data record. Thus, it is possible, for example, to use an optical measuring method to generate a data record of the measurement object, wherein this data record forms the structure position data record. Then, the further data record can be generated using a tactile measuring method. Expressed differently, a structure position data record can be generated in addition to the further data record, in particular before the further data record is generated, said structure position data record then being used to determine position information items and/or orientation information items. It is possible that the structure position data record is generated at the runtime of carrying out the method.

What can advantageously be achieved by generating a structure position data record is that where possible all same or similar structures are tested, in particular if these are arranged at an unexpected position in the case of the actual measurement object on account of tolerances.

However, structure-specific position information items and/or orientation information items could also be determined while same or similar structures are determined in a data record, in particular in a target data record.

Alternatively, these structure-specific position information items and/or orientation information items may also be known in advance. By way of example, should it be known that the measurement object comprises an arrangement of a plurality of the same or similar structures, e.g., a plurality of cylindrical blind hole or passage openings along a circular line, a matrix-like arrangement of such openings or a honeycomb structure, position information items and/or orientation information items, known in advance and arising from this arrangement, for example information items about a target relative position and/or target relative orientation between the structures, could thus be taken into account when searching for these same or similar structures in the data record. In particular, the subsets of the further data record to be searched for the same or similar structures can be set on account of the structure-specific position information items and/or orientation information items.

It is also possible that, in particular on account of information items about a relative position and/or orientation of the same or similar structures, a portion for the search for a further same or similar structure can be set after the detection of a first similar or same structure, in particular on the basis of the position and/or orientation of the first detected structure.

Thus, if a reference structure and at least one same or similar structure were set/determined in one or more data records, the corresponding position and/or orientation information items can be used to set portions for searching for the similar or same structures within a further data record. Naturally, the portions should be chosen in such a way here that tolerances, in particular for inaccuracies resulting from the measurement, are taken into account. As a result of this, there advantageously is a further acceleration when generating the test plan.

If structure-specific position information items and/or orientation information items, which are known in advance or determined in advance, are taken into account during the test on the basis of data as to whether structures that are similar to or the same as the reference structure are present in the further data record, a test criterion can be whether the position and/or orientation of a similar or same structure in the further data record does not deviate by more than a predetermined measure from the position and/or orientation set by the structure-specific position information and/or orientation information.

In a further embodiment, a data record representing the measurement object is a three-dimensional data record. Here, a three-dimensional data record denotes a spatial representation of the measurement object in three dimensions, expressed differently, a volume data record. In particular, a three-dimensional data record can be formed by voxels or comprise voxels. Further, a three-dimensional data record can be set by a point cloud or a polygon mesh, in particular a triangular mesh. A three-dimensional data record can also be set in the form of a CAD model. By way of example, this can be a mathematical description of the measurement object by curves and areas.

In an alternative embodiment, a data record representing the measurement object is a two-dimensional data record. A two-dimensional data record can denote a representation of the measurement object in two dimensions. In particular, a two-dimensional data record can be a two-dimensional image representation of the measurement object. In particular, a two-dimensional data record can be formed by pixels or comprise pixels.

In a further embodiment, the data record is an image data record. This can mean that the data record was generated by an imaging measuring method, for example by imaging by means of an optical capturing device or imaging by means of a CT device. Further, a target data record can also be an image data record, in particular a CAD data record.

In a further embodiment, a test feature is assigned to the reference structure on the basis of an assignment known in advance. By way of example, the assignment known in advance can be provided in the form of a library, wherein this assignment known in advance may comprise a plurality of mutually different structures, wherein at least one test feature can be assigned to each of these structures. By way of example, it is possible to determine whether the reference structure determined in the data record is the same as or similar to one of the structures present in the assignment. Should this be the case, the corresponding test feature or the corresponding test features can be assigned to the reference structure.

This advantageously brings about a further acceleration when generating a test plan since use can be made of assignments known in advance. By way of example, this assignment can be used in the automatic assignment of test features or semi-automatic assignment of test features, as explained above.

Alternatively or cumulatively, a geometric element is assigned to the reference structure on the basis of an assignment known in advance. Consequently, a further assignment can be present, for example in the form of a library comprising a plurality of structures, wherein at least one geometric element is assigned to each of these structures. By way of example, it is possible to determine whether the reference structure determined in the data record is the same as or similar to one of the structures present in the assignment. Should this be the case, the corresponding geometric element or the corresponding geometric elements can be assigned to the structure.

Further alternatively or cumulatively, at least one geometric element can be assigned to a test feature on the basis of an assignment known in advance. Consequently, a further assignment can be present, for example in the form of a library comprising a plurality of test features, wherein at least one geometric element is assigned to each of these features. By way of example, it is possible to determine whether the determined feature is the same as or similar to one of the features present in the assignment. Should this be the case, the corresponding geometric element or the corresponding geometric elements can be assigned to the feature.

It is also possible that the test feature is proposed to a user or an overarching system on the basis of the assignment between test feature and at least one geometric element. Thus, the data record can be searched for a geometric element, with an assigned test feature then being proposed if the geometric element or a geometric element similar thereto was found. By way of example, this can be used when setting test features automatically or semi-automatically.

It is also possible that the assignment(s) known in advance are expanded, for example if the user sets a reference structure that is not present in the assignment and assigns a test feature and/or a geometric element to said reference structure. Then, this assignment can be included in the existing assignment.

In a further embodiment, a criterion for determining the similarity of structures in a target data record is more stringent than a criterion for determining the similarity of structures in a data record generated by measurement. In particular, a test can be carried out as to whether structures that are same as the reference structure are present in a target data record, with no test, however, being carried out as to whether structures that are similar to the reference structure are present. In contrast thereto, a test can be carried out in a measurement data record generated by measurement as to whether structures that are similar to or the same as the reference structure are present. Alternatively, the measure of an admissible deviation between a property of the reference structure and a corresponding property of a similar structure can be smaller when evaluating a target data record than when evaluating a data record generated by measurement.

Consequently, the method according to the invention can comprise a further partial step, wherein a criterion for testing in respect of similar or the same structures is set in this partial step, wherein this setting is implemented on the basis of the type of the data record, specifically depending on whether the data record is a target data record or a data record generated by measurement. In particular, this partial step can be carried out before the test for similar or the same structures.

In a further embodiment, the method is carried out as a simulation. Expressed differently, it is possible for a data record representing the measurement object to be generated by simulation of a measurement method. To this end, a method for generating a virtual image representation of the measurement object, for example, can be applied. Such a method is disclosed in, e.g., WO 2014/19130 A1, the entire disclosure of which is referred to herewith. In particular, such methods also facilitate the simulation of optical or tactile measurement methods.

Also proposed is a program which, when executed on or by a computer or the evaluation device described above, causes the computer to carry out one, a plurality or all of the steps of the method illustrated in this disclosure for generating a test plan for testing a measurement object. Alternatively or cumulatively, a program storage medium or computer program product, on or in which the program is stored, in particular in a non-temporary, i.e. permanent, form, is described. Alternatively or cumulatively, a computer which comprises this program storage medium is described. Moreover, alternatively or cumulatively, a signal is described, for example a digital signal, which codes information items representing the program and which comprises coding means suitable for performing one, a plurality or all of the steps of the method set out in this disclosure for generating a test plan for testing a measurement object. The signal can be a physical signal, for example an electrical signal, which in particular is generated technically or by machine.

Furthermore, the method for generating a test plan for testing a measurement object can be a computer-implemented method. In this regard, for example, one, a plurality or all of the steps of the method can be carried out by a computer. One embodiment of the computer-implemented method is the use of the computer for carrying out a data processing method. For example, the computer can comprise at least one computing device, in particular a processor, and for example at least one storage device, in order to process the data, in particular technically, for example electronically and/or optically. A computer can in this case be any kind of data processing appliance. A processor can be a semiconductor-based processor.

Further, an apparatus for generating a test plan for testing a measurement object is proposed. Here, the apparatus serves to carry out a method for generating a test plan in accordance with one of the embodiments disclosed in this invention. Consequently, the apparatus is embodied accordingly.

The apparatus comprises at least an interface for reading a data record and at least an evaluation device. The evaluation device can comprise at least a computing device, in particular a computing device embodied as a microcontroller or processor. The evaluation device can also be a computer or a part thereof. Further, a data record representing the measurement object is able to be read via the interface. As explained above, this data record can be a target data record, which is stored in a storage device, for example, or it can be a data record generated by measurement.

Further, a reference structure is able to be set and at least one reference structure-specific test feature is able to be assigned to the reference structure on the basis of the data, in particular by way of the evaluation device. Further, it is possible to test on the basis of data for the data record representing the measurement object whether structures that are similar to or the same as the reference structure are present, in particular likewise by means of the evaluation device explained above, wherein the reference structure-specific test feature is assignable to each similar or same structure as structure-specific test feature, wherein the test plan comprises the structure-specific test features determined thus.

Here, the apparatus can further comprise an input device user inputs, for example in the form of a touchscreen, a keyboard or a mouse or in the form of further input devices.

Further, the apparatus can comprise at least one storage device, in particular for storing a target data record, for storing test features, for storing a measurement data record, for storing assignments, for storing positions and/or orientation, etc.

Further, the apparatus can also comprise a measuring device for measuring the measurement object.

A method for testing or measuring a measurement object is furthermore proposed. In this method, a test plan as per an embodiment, described in this disclosure, of a method for generating a test plan is generated Here, the test plan can be generated on the basis of a data record generated by measuring the measurement object or a similar measurement object or on the basis of a target data record.

Further, the measurement object is measured on the basis of this test plan. In particular, as already explained above, measurement points of the measurement object to be captured on the basis of the test plan can be set. These can then be captured during the measurement. Then, as likewise already described above, the test features can be captured on the basis of the measurement points. Further, test criteria can be evaluated on the basis of these test features, for example by way of so-called threshold-based methods.

The method for testing could be carried out as a simulation. Here, the measurement, in particular, can be simulated, in particular by virtue of a virtual image representation of a measurement object to be tested being generated and this virtual representation of the measurement object being measured on the basis of the test plan, in particular by simulating a measuring method. In this respect, reference is once again made to WO 2014/19130 A1, mentioned above.

Further, an apparatus for testing a measurement object is also proposed. Here, the apparatus comprises an apparatus for generating a test plan in accordance with one of the embodiments described in this disclosure. Further, the apparatus comprises a measuring device. Further, the apparatus may comprise a control device. The measuring device is controllable by means of the control device in such a way that measurement points of the measurement object, which were set on the basis of the test plan, are capturable.

Here, the apparatus advantageously serves to carry out a method for testing a measurement object in accordance with one of the embodiments described in this disclosure.

Further areas of applicability of the present disclosure will become apparent from the detailed description, the claims, and the drawings. The detailed description and specific examples are intended for purposes of illustration only and are not intended to limit the scope of the disclosure.

DETAILED DESCRIPTION

Identical reference signs hereinafter denote elements having identical or similar technical features.

Figure 1:
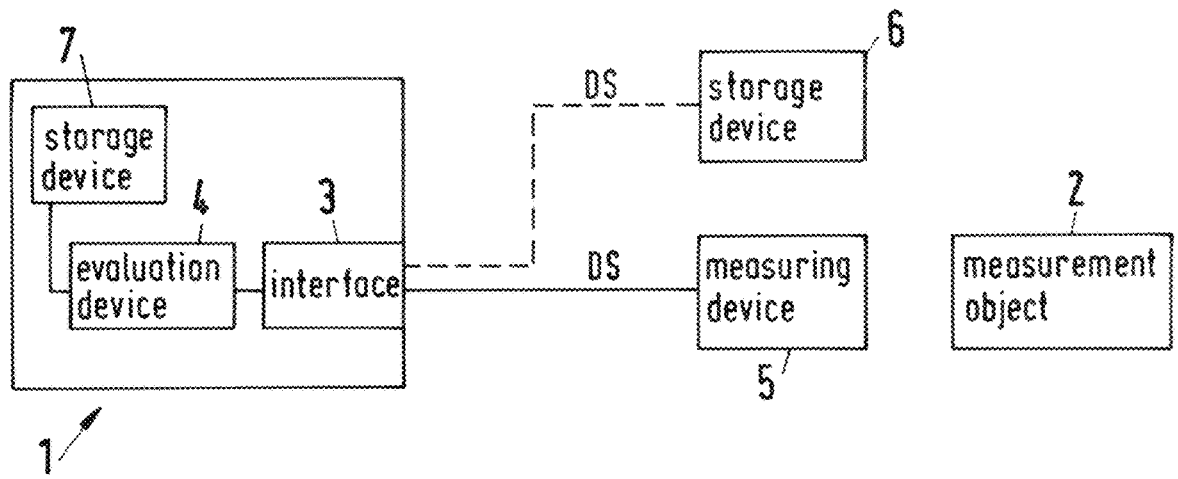
FIG. 1 shows a schematic block diagram of an apparatus according to the invention.

FIG. 1 illustrates a schematic block diagram of an apparatus 1 according to the invention for generating a test plan for testing a measurement object 2. The apparatus 1 comprises an interface 3 for reading a data record DS and at least an evaluation device 4. FIG. 1 illustrates that a data record DS, which represents the measurement object 2 to be tested or measured, can be read from a storage device 6. Here, target data of the measurement object 2, e.g., in the form of CAD data, can be stored in the storage device.

Additionally, the data record DS can be generated by a measuring device 5, e.g., a coordinate measuring machine, wherein this data record DS generated thus (i.e., the data record DS generated by the measurement) is read by the apparatus 1.

Further, a storage device 7 of the apparatus 1 is illustrated, in which storage device information items required for the method for generating the test plan can be stored.

Figure 2:
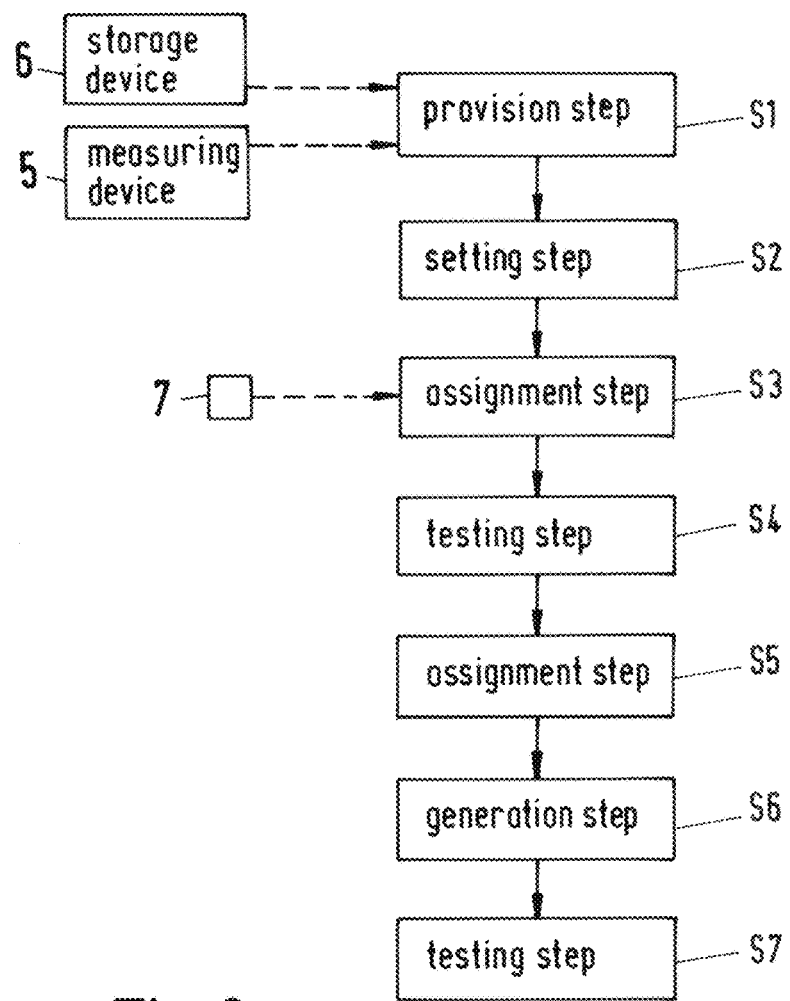
FIG. 2 shows a schematic flow chart of a method according to the invention.

The method schematically illustrated in FIG. 2 is able to be carried out by means of the apparatus 1 illustrated in FIG. 1.

FIG. 2 illustrates a flowchart of a method according to the invention for generating a test plan for testing a measurement object 2 (see FIG. 1).

In a first step S1, a data record DS representing the measurement object 2 is provided. As explained above, this provision can be implemented in the form of a target data record, which can be read from a storage device 6, for example. Alternatively, this data record can be provided by measuring the measurement object 2, for example by means of a coordinate measuring machine 5.

On the basis of this measurement data, i.e., on the basis of data, a reference structure is set in a second step S2. By way of example, the reference structure can be a circular reference structure RS1 (see FIG. 3), a rectangular reference structure RS2 (see FIG. 4A), a spherical reference structure RS3 (see FIG. 5) or a reference structure RS4 with any desired embodiment (see FIG. 6).

This reference structure RS1, . . . , RS4 can be set by a user input, for example. By way of example, a user can select a region of interest (ROI), which comprises or forms the reference structure, in a representation of the data record, e.g., in a graphical representation such as an image.

Alternatively, a reference structure RS1, . . . , RS4 could also be determined automatically or semi-automatically. To this end, an assignment, known in advance, between various reference structures and properties determinable on the basis of data can be used. By way of example, different subsets of the data record can be examined and it is possible to determine whether properties of the subset correspond to the properties of a reference structure of the assignment or deviate therefrom by no more than a predetermined measure. Should this be the case, such a subset can be determined as a reference structure RS1, . . . , RS4 or can be proposed to the user for selection purposes.

In a third step S3, at least one reference structure-specific test feature is assigned to the reference structure RS1, . . . , RS4. By way of example, this can be implemented by virtue of at least one geometric element being assigned to the reference structure RS1, . . . , RS4. Here, the reference structure-specific test feature is determined on the basis of the at least one geometric element. Alternatively, a test feature can be directly assigned to the reference structure.

FIG. 2 illustrates that, e.g., assignments, known in advance, between various reference structures RS1, . . . , RS4 and test features and/or between various reference structures RS1, . . . , RS4 and geometric elements can be stored in a storage device 7. After setting the reference structure RS1, . . . , RS4 in the second step S2, it is then possible to determine by way of an evaluation of the assignments whether the set reference structure corresponds to a reference structure RS1, . . . , RS4 of this assignment or deviates therefrom by no more than a predetermined measure. Should this be the case, the test feature or the geometric element known from the assignment can be assigned to the reference structure RS1, . . . , RS4. Further, an assignment between a geometric element and the test feature can also be stored, wherein, in that case, the corresponding geometric element-specific test feature is assigned to the reference structure RS1, . . . , RS4 on the basis of the assignment.

In the first step S1, the data record DS can be provided, e.g., by a measuring device 5 on account of a measurement of the measurement object 2. Alternatively, the data record DS can be read from a storage device 6.

In a fourth step S4, a test is carried out on the basis of data for the data record DS representing the measurement object as to whether structures that are similar to or the same as the reference structure RS1, . . . , RS4 are present. In a fifth step S5, the reference structure-specific test feature of the detected similar or same structure determined in the third step S3 for the reference structure RS1, . . . , RS4 is assigned to each same or similar structure. In a sixth step S6, the test plan is generated in such a way that it comprises the structure-specific test features determined thus.

In a method according to the invention for testing a measurement object 2 (see FIG. 1), such a test plan can be generated in accordance with a method comprising steps S1 to S6, wherein the measurement object 2 can then be tested in accordance with the test plan in a seventh step S7.

Figure 3:
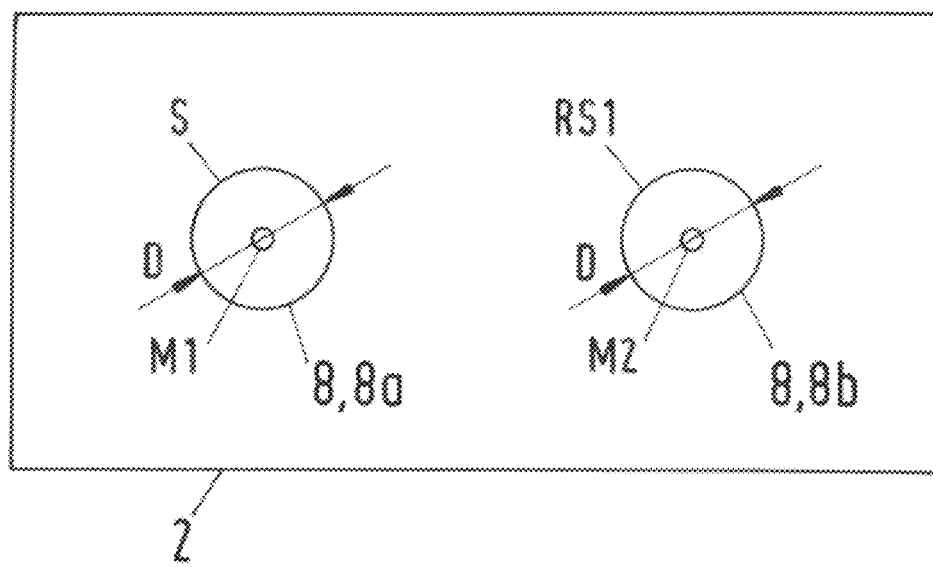
FIG. 3 shows a schematic plan view of a measurement object.

FIG. 3 schematically illustrates a measurement object 2, which has a planar embodiment and, purely by way of example, has two openings 8. By way of example, these openings 8 can be embodied as passage openings or as blind hole-type openings. A first opening 8a has a first center M1. A second opening 8b has a second center M2. Here, in the plan view, the measurement object 2 has a rectangular embodiment. In this case, the second opening 8b, for example, could form a reference structure RS1 and could be set as such. By way of example, a circular geometric element can be assigned to this reference structure RS1. A test feature can be a diameter D of this circular geometric element.

Here, the measurement object 2 can be imaged by an image capturing device, for example, wherein the data record representing the measurement object 2 can be an image data record. Then, an examination can be carried out in this image data record on the basis of data, i.e., in particular on the basis of the image, as to whether structures that are similar to or the same as the reference structure RS1 are present. By way of example, image properties of the reference structure RS1 can be determined, in particular bijective image properties. Subsets can be searched for in the data record, which subsets have the same or similar image properties. In the process, the further structure S, for example, can be found, which has the same or similar image properties as the reference structure RS1. This further structure S, which corresponds to the first opening 8a, can then likewise be assigned the test feature of a diameter D.

Then, a test plan for the measurement object 2 illustrated in FIG. 3 can comprise a test feature of the diameter D assigned to the reference structure RS1 and the test feature of a diameter D assigned to the structure S, i.e., the first opening 8a.

Further, the test plan can also comprise target values for the diameter D. Further, the test plan can also contain admissible deviations from the target diameter. Further, the test plan can also comprise a test criterion, for example whether the determined diameter D deviates by no more than a predetermined measure from the target diameter.

Figure 4A:
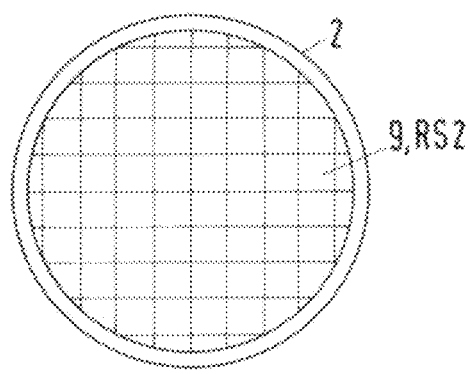
FIG. 4A shows a schematic plan view of a measurement object.

FIG. 4A shows a schematic plan view of a measurement object 2 embodied as a sieve, which has a multiplicity of meshes 9. For the sake of overall clarity, only one mesh 9 is provided with a reference sign. In such a case, one of the meshes 9 can be set as a reference structure RS2 on the basis of data. The rectangle or square element, for example, can be assigned to this mesh 9 as a geometric element. By way of example, the width or height of the rectangle or square can be assigned to the reference structure RS2 as a test feature.

Figure 4B:
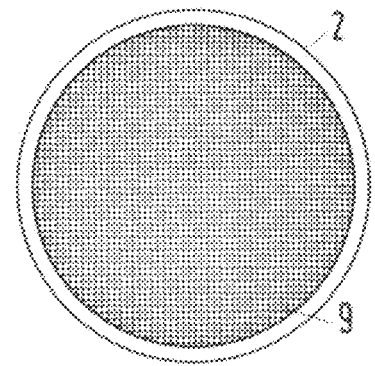
FIG. 4B shows a schematic plan view of a measurement object.
Figure 4C:
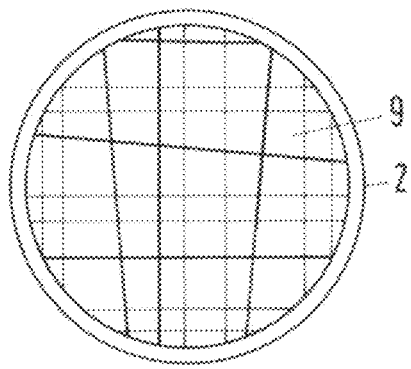
FIG. 4C shows a schematic plan view of a measurement object.

FIG. 4B and FIG. 4C illustrate further measurement objects 2 embodied as a sieve, the meshes 9 of which, like in the example illustrated in FIG. 4B, are similar or correspond to the reference structure but have geometric dimensions deviating therefrom, i.e., a deviating width or a deviating height. Depending on the deviation of the height and/or width, such a structure can then be determined as a structure that is not similar to the reference structure, with the test feature of the reference structure then not being assigned to such a structure.

In FIG. 4C, the measurement object embodied as a sieve comprises meshes 9 which are not similar to or the same as the reference structure since they deviate from the intended geometry of a rectangle or square. Consequently, the test feature of the reference structure is not assigned to these deviating meshes 9 either.

During the test of the measurement object 2, it is also possible to test whether the number of the structures similar to the reference structure RS3 deviates from an expected number, known in advance, or whether the number of detected same or similar structures lies outside a range, known in advance, of similar or same structures to be expected. Should this be the case, this can be adopted in the test result.

Figure 5:
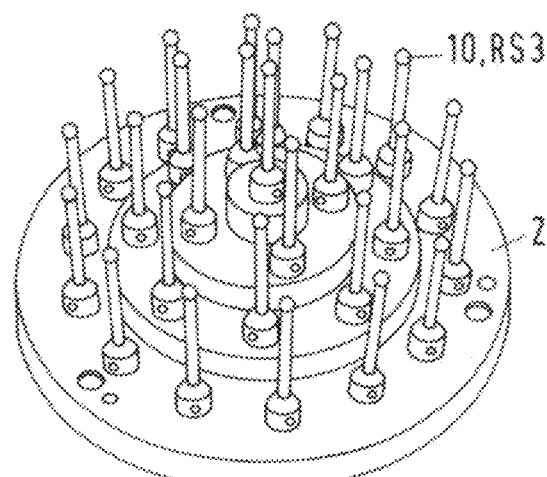
FIG. 5 shows a perspective view of a measurement object.

FIG. 5 illustrates a schematic perspective view of a measurement object 2 embodied as an acceptance standard, with the latter serving as an acceptance standard for CT measuring devices. Spherical standard elements 10 are illustrated, wherein one of these spherical standard elements 10 can be set as a reference structure RS3. By way of example, the sphere geometric element can be assigned to this spherical standard element 10, with the latter then being able to be assigned a diameter as a test feature.

If an image representation of the measurement object 2, e.g., a CT-based image representation, is generated, all illustrated spherical standard elements in the image representation can be identified as structures that are the same as or similar to the reference structure RS3, and then the explained test feature can be assigned to each thereof. This simplifies the generation of the test plan for the illustrated acceptance standard.

Figure 6:
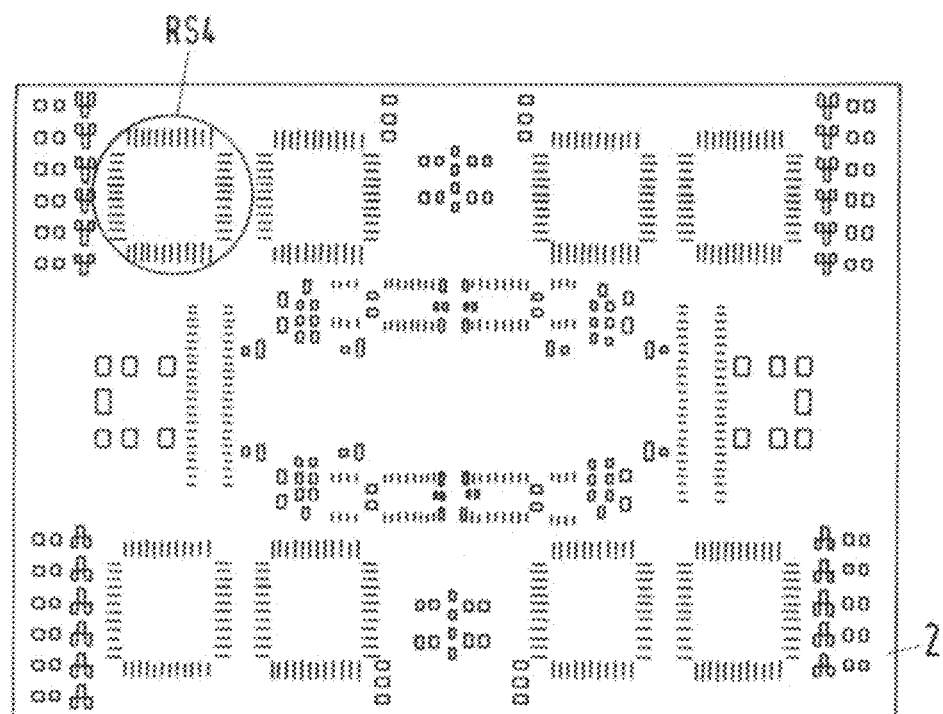
FIG. 6 shows a schematic plan view of a measurement object and FIG. 7 shows a detailed view of the measurement object illustrated in FIG. 6.

FIG. 6 illustrates a schematic plan view of a measurement object 2 embodied as a circuit board. The data record DS representing this measurement object 2 can then be generated by means of, e.g., an image capturing device, i.e., as an image data record. What is illustrated is that structures of the same kind are arranged on the circuit board, said structures substantially being embodied in rectangular fashion. In the illustrated example embodiment, these structures are the image representations of soldering areas of computer chips. Here, one of the structures is set as a reference structure RS4.

Figure 7:
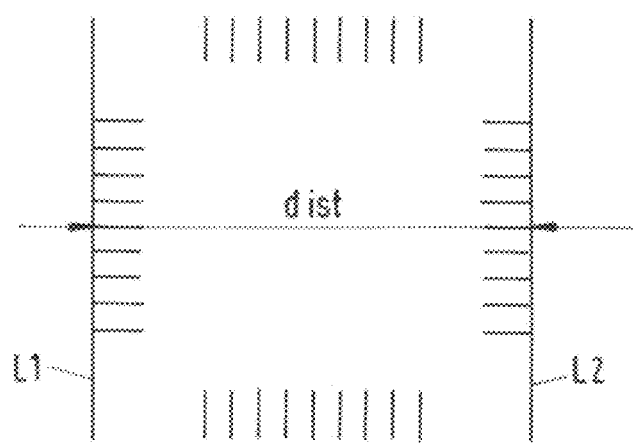

FIG. 7 illustrates a detailed view of this reference structure RS4. What is furthermore illustrated is that two lines L1, L2 are assigned to this reference structure RS4 as geometric elements, with a distance dist between the lines then being assigned to the reference structure RS4 as a test feature. By way of example, this distance dist can be determined by means of a method, known to a person skilled in the art, for determining a distance dist between two lines L1, L2.

Then, it is possible to search for similar or the same structures on the basis of images in the image data record, which represents the measurement object 2 illustrated in FIG. 6 and embodied as a circuit board, wherein the explained test feature of the distance dist between two lines L1, L2 is assigned to these similar or the same structures, i.e., seven further structures in the present example embodiment. Thus, during the test, the corresponding lines L1, L2 and then their distance dist are determined for each of these structures.

The phrase "at least one of A, B, and C" should be construed to mean a logical (A OR B OR C), using a non-exclusive logical OR, and should not be construed to mean "at least one of A, at least one of B, and at least one of C."

LIST OF REFERENCE SIGNS

1 Apparatus
2 Measurement object
3 Interface
4 Evaluation device
5 Measuring device
6 Storage device
7 Storage device
8 Opening
8a First opening
8b Second opening
9 Mesh
10 Spherical geometric element
RS1 First reference structure
RS2 Second reference structure
RS3 Third reference structure
RS4 Fourth reference structure
M1 First center
M2 Second center
S Structure
S1 First step
S2 Second step
S3 Third step
S4 Fourth step
S5 Fifth step
S6 Sixth step
S7 Seventh step
D Diameter

What is claimed is:

1. A computer-implemented method for controlling a measuring device, the computer-implemented method comprising:
obtaining a data record representing a measurement object;
setting a reference structure based on the data;
assigning at least one reference structure-specific test feature to the reference structure, wherein:
a test is carried out based on data for the data record representing the measurement object as to whether structures that are similar to or identical to the reference structure are present, and
the reference structure-specific test feature is assigned to each similar or identical structure as the structure-specific test feature;
generating a test plan to include the structure-specific test features; and
controlling the measuring device to perform a measurement procedure based on the test plan to capture measurement points of the measurement object.

2. The computer-implemented method of claim 1, wherein at least one geometric element is assigned to the reference structure, wherein the reference structure-specific test feature is determined based on the at least one geometric element.

3. The computer-implemented method of claim 2, wherein the data record representing the measurement object is at least one of (i) generated by measuring the measurement object represented by the data record and (ii) a target data record.

4. The computer-implemented method of claim 1, wherein the data record representing the measurement object is at least one of (i) generated by measuring the measurement object represented by the data record and (ii) a target data record.

5. The computer-implemented method of claim 1, wherein:
a test is carried out based on data for a further data record representing the measurement object or a further measurement object as to whether structures that are similar to or identical to the reference structure are present;
the reference structure-specific test feature is assigned to each similar or identical structure; and
the test plan is generated to include the reference structure-specific test features.

6. The computer-implemented method of claim 5, wherein the further data record is generated by measuring at least one of the measurement object and another measurement object of a same kind as the measurement object.

7. The computer-implemented method of claim 6, wherein a criterion for determining the similarity of structures in a target data record is more stringent than a criterion for determining the similarity of structures in a data record generated by measurement.

8. The computer-implemented method of claim 5, wherein structure-specific position information items and/or orientation information items known in advance or determined in advance are taken into account during the test based on data as to whether structures that are similar to or identical to the reference structure are present in the further data record.

9. The computer-implemented method of claim 6, wherein structure-specific position information items and/or orientation information items known or determined in advance are taken into account during the test based on data as to whether structures that are similar to or identical to the reference structure are present in the further data record.

10. The computer-implemented method of claim 1, wherein the data record representing the measurement object is a three-dimensional data record.

11. The computer-implemented method of claim 1, wherein the data record representing the measurement object is a two-dimensional data record.

12. The computer-implemented method of claim 1, wherein the data record is an image data record.

13. The computer-implemented method of claim 1, wherein a test feature is assigned to the reference structure based on an assignment known in advance and/or in that a geometric element is assigned to the reference structure based on an assignment known in advance.

14. The computer-implemented method of claim 1, wherein a criterion for determining the similarity of structures in a target data record is more stringent than a criterion for determining the similarity of structures in a data record generated by measurement.

15. The computer-implemented method of claim 1, wherein the method is carried out as a simulation.

16. The computer-implemented method of claim 1, further comprising testing the measurement object in accordance with the test plan.

17. A non-transitory computer-readable medium comprising processor-executable instructions that embody the computer-implemented method of claim 1.

18. The computer-implemented method of claim 1 wherein the measuring device includes a coordinate measuring machine.

19. An apparatus comprising:
an interface;
an evaluation device communicatively coupled with the interface; and
a measuring device communicatively coupled with the interface and the evaluation device and configured to capture measurement points of a measurement object,
wherein:
  the interface is configured to read a data record representing the measurement object,
  the evaluation device is configured to set a reference structure based on data,
  the evaluation device is configured to assign at least one reference structure-specific test feature to the reference structure,
  the evaluation device is configured to test, based on data for the data record representing the measurement object, whether structures similar to or identical to the reference structure are present,
  the evaluation device is configured to assign the reference structure-specific test feature to each similar or identical structure as a structure-specific test feature,
  the evaluation device is configured to generate a test plan including the structure-specific test features, and
  the measuring device is configured to perform a measurement procedure based on the test plan to capture the measurement points of the measurement object; and
a control device configured to control the measuring device to test the measurement object in accordance with the test plan.

\* \* \* \* \*